(12) United States Patent
Park et al.

(10) Patent No.: US 10,026,683 B2
(45) Date of Patent: Jul. 17, 2018

(54) INTEGRATED CIRCUIT PACKAGE SUBSTRATE

(71) Applicant: CORNING PRECISION MATERIALS CO., LTD., Asan-si, Chungcheongnam-do (KR)

(72) Inventors: Hyun Hang Park, Asan-si (KR); Bo Gyeong Kim, Asan-si (KR); Hyun Bin Kim, Asan-si (KR); Sung Hoon Lee, Asan-si (KR)

(73) Assignee: CORNING PRECISION MATERIALS CO., LTD., Asan-si, Chungcheongnam-do (KR)

( * ) Notice: Subject to any disclaimer, the term of this patent is extended or adjusted under 35 U.S.C. 154(b) by 0 days.

(21) Appl. No.: 15/562,863

(22) PCT Filed: Apr. 6, 2016

(86) PCT No.: PCT/KR2016/003560
§ 371 (c)(1),
(2) Date: Sep. 28, 2017

(87) PCT Pub. No.: WO2016/163728
PCT Pub. Date: Oct. 13, 2016

(65) Prior Publication Data
US 2018/0114746 A1    Apr. 26, 2018

(30) Foreign Application Priority Data
Apr. 6, 2015  (KR) .................. 10-2015-0048473

(51) Int. Cl.
*H01L 23/498*   (2006.01)
(52) U.S. Cl.
CPC .. *H01L 23/49827* (2013.01); *H01L 23/49894* (2013.01)

(58) Field of Classification Search
CPC ................ H01L 23/49827; H01L 23/49894
See application file for complete search history.

(56) References Cited

U.S. PATENT DOCUMENTS

| 6,248,960 B1 * | 6/2001 | Ami .................. H01L 23/49827 156/89.12 |
| 9,875,981 B2 * | 1/2018 | Lee ......................... H01L 24/14 |

(Continued)

OTHER PUBLICATIONS

International Search Report dated Jun. 30, 2016 issued in International Patent Application No. PCT/KR2016/003560 (with English translation).

*Primary Examiner* — Nathan W Ha
(74) *Attorney, Agent, or Firm* — McDermott Will & Emery LLP

(57) ABSTRACT

The present invention relates to an integrated circuit package substrate and, more specifically, to an integrated circuit package substrate, which exhibits excellent conductivity and reliability through the improvement of an adhesive force between a metal line for electrically connecting an upper part and a lower part of the integrated circuit package substrate and glass formed inside the integrated circuit package substrate. To this end, the present invention provides the integrated circuit package substrate comprising: a core part made of glass; a first metal thin plate formed on the upper part of the core part and made of Cu; a second metal thin plate formed at the lower part of the core part and made of Cu; a metal line formed in a shape in which the metal line penetrates through the first metal thin plate, the core part, and the second metal thin plate so as to electrically connect the first metal thin plate and the second metal thin plate, and made of Cu; and an intermediate layer formed on the outer circumferential surface of the metal line, wherein the inter- (Continued)

mediate layer includes any one of $Cu_2O$, $Cu_2O$ doped with a transition metal, and a metal oxide including Cu and a transition metal.

10 Claims, 3 Drawing Sheets

(56) References Cited

U.S. PATENT DOCUMENTS

| | | | |
|---|---|---|---|
| 9,941,196 B2* | 4/2018 | Lee | H01L 23/49844 |
| 2007/0008705 A1* | 1/2007 | Hashimoto | H01L 23/49827 361/760 |
| 2011/0304999 A1* | 12/2011 | Yu | H01L 23/15 361/783 |
| 2012/0273939 A1* | 11/2012 | Dai | H01L 21/76898 257/737 |
| 2013/0119555 A1* | 5/2013 | Sundaram | H01L 21/486 257/774 |
| 2013/0181325 A1* | 7/2013 | Chen | H01L 23/49827 257/532 |
| 2013/0264101 A1* | 10/2013 | Furuichi | H05K 1/115 174/251 |
| 2014/0104802 A1* | 4/2014 | Oikawa | H05K 1/18 361/783 |
| 2014/0113404 A1* | 4/2014 | Rossini | H01L 27/14632 438/98 |
| 2014/0291841 A1* | 10/2014 | Mitsuhashi | H01L 21/76877 257/737 |

* cited by examiner

Formation of Chemical Bond

[Cu$_2$O–Cu Boundary]

Formation of Chemical Bond

[Cu₂O-Glass Boundary]

[Cu-Glass Boundary]

[Cu₂O-Glass Boundary]

Formation of Chemical Bond

Ta-doped Cu$_2$O Portion

Glass Portion

[Ta-doped Cu$_2$O-Glass Boundary]

[Adsorption Energy of Metal-doped Cu$_2$O-Glass Boundary]

INTEGRATED CIRCUIT PACKAGE SUBSTRATE

CROSS REFERENCE

This patent application is the U.S. National Phase under 35 U.S.C. § 371 of International Application No. PCT/KR2016/003560, filed on Apr. 6, 2016, which claims the benefit of Korean Patent Application No. 10-2015-0048473, filed on Apr. 6, 2015, the entire contents of each are hereby incorporated by reference.

BACKGROUND

Field

The present disclosure relates to a substrate for an integrated circuit (IC) package. More particularly, the present disclosure relates to a substrate for an IC package, in which superior electrical conductivity and reliability are obtained through improving bonding force between a metal line connecting the upper and lower portions of the substrate and glass disposed within the substrate.

A substrate for an IC package is an intermediate substrate electrically connecting a semiconductor chip to a printed circuit board (PCB), acting as an interface to transfer electrical signals between semiconductor chips and the PCB. Conventionally, copper clad laminates (CCLs) have been used for substrates for an IC package. However, a CCL substrate for an IC package has problems, for example, regarding high-temperature deformation and bulk modulus, since the core thereof is formed from, for example, prepreg (PPG), a polymer composite of impregnated glass fibers.

To overcome these problems, willow copper clad laminates (WCCLs), substituting the core of the CCL with flexible glass, for example, willow glass available from Corning, have been introduced.

A process of drilling a hole in a substrate for an IC package, the hole extending from the top portion to the bottom portion of the substrate, and filling the hole with copper (Cu) is essentially required to allow current to flow throughout the substrate for an IC package. However, when Cu is deposited in the hole using electroless plating, bonding force between deposited Cu and the glass of the core may be insufficient. This consequently lowers the conductivity of the substrate for an IC package and causes other problems, such as a disconnection.

To overcome these problems, modifications of the Cu deposition method have been considered. However, the hole in which Cu is to be deposited has the shape of a long and slender cylinder, extending from the top portion to the bottom portion of the substrate for an IC package, i.e. a shape having a high aspect ratio. Consequently, it is impossible to use a physical deposition process, such as sputtering. In addition, since it is highly likely that high temperature processing may deform the substrate for an IC package, chemical vapor deposition (CVD) cannot be used either.

Therefore, a method or technology to increase bonding force between Cu and glass, using electroless plating, is urgently required.

RELATED ART DOCUMENT

Patent Document 1: Korean Patent No. 10-0648968 (Nov. 16, 2006)

BRIEF SUMMARY

Various aspects of the present disclosure provide a substrate for an integrated circuit (IC) package, in which superior electrical conductivity and reliability are obtained through improving bonding force between a metal line connecting the upper and lower portions of the substrate and glass disposed within the substrate.

According to an aspect, a substrate for an IC package may include: a core formed from glass; a first metal thin film disposed on the core, the first metal thin film being formed from (Cu); a second metal thin film disposed below the core, the second metal thin film being formed from Cu; a metal line extending through the first metal thin film, the core, and the second metal thin film to electrically connect the first metal thin film and the second metal thin film to each other, the metal line being formed from Cu; and an interlayer disposed on the outer circumferential surface of the metal line. The interlayer is formed from one selected from among $Cu_2O$, $Cu_2O$ doped with a first transition metal, and a metal oxide comprising Cu and a second transition metal.

The $Cu_2O$ may contain x atomic percent of the first transition metal, where $5<x<10$.

Each of the first and second transition metal may be at least one selected from a candidate group consisting of Ti, Cr, Hf, Nb, and Ta.

The metal oxide may be a ternary or quaternary metal oxide.

Here, the metal oxide may be perovskite.

Alternatively, the metal oxide may be delafossite.

The substrate may be situated between a semiconductor chip and a printed circuit board to electrically connect the semiconductor chip and the printed circuit board to each other.

Here, the first metal thin film may be electrically connected to the semiconductor chip, and the second metal thin film is electrically connected to the printed circuit board.

The substrate may further include polymer layers situated between the first metal thin film and the core and between the core and the second metal thin film, respectively.

The polymer layers may be formed from prepreg.

According to the present disclosure, the interlayer formed from one selected from among $Cu_2O$, $Cu_2O$ doped with a transition metal, a ternary metal oxide, and a quaternary metal oxide is situated between the metal line electrically connecting the top portion and the bottom portion of a substrate for an IC package and glass disposed within the substrate for an IC package, thereby improving bonding force between the metal line and glass. This can consequently obtain superior conductivity and reliability.

In addition, according to the present disclosure, the improved bonding force between the metal line and glass can improve the yield of substrates for IC packages, thereby reducing manufacturing costs.

DETAILED DESCRIPTION

Figure 1:
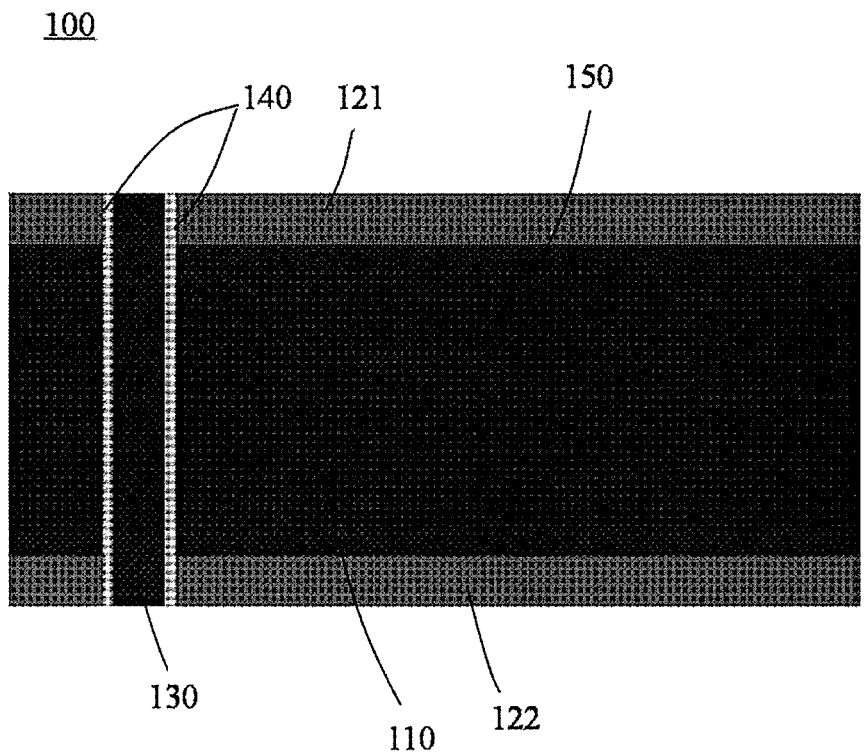
FIG. 1 is a cross-sectional view schematically illustrating a substrate for an IC package according to an exemplary embodiment.

Hereinafter, reference will now be made to a substrate for an integrated circuit (IC) package according to the present disclosure in detail, embodiments of which are illustrated in the accompanying drawings and described below, so that a person having ordinary skill in the art to which the present disclosure relates could easily put the present disclosure into practice.

Throughout this document, reference should be made to the drawings, in which the same reference numerals and symbols will be used to designate the same or like components. In the following description, detailed descriptions of known functions and components incorporated herein will be omitted in the case that the subject matter of the present disclosure is rendered unclear by the inclusion thereof.

A substrate for an IC package (hereinafter, also referred to as an IC package substrate) 100 according to an exemplary embodiment as illustrated in FIG. 1 is an intermediate member or an intermediate substrate situated between a semiconductor chip and a printed circuit board (PCB) to electrically connect the semiconductor chip and the PCB. The IC package substrate 100 according to the exemplary embodiment includes a core 110, a first metal thin film 121, a second metal thin film 122, a metal line 130, and an interlayer 140.

The core 110 is defined as a central portion of the interior of the IC package substrate 100. The core 110 may be formed from glass, and more particularly, may be formed as a flexible glass plate or a thin glass plate. For example, the core 110 may be formed from willow glass available from Corning. When the core 110 is formed from glass, it is possible to reduce the related-art problems regarding high-temperature deformation and bulk modulus occurring in the case in which the core of the substrate for an IC package is famed from prepreg (PPG).

The first metal thin film 121 may be a copper (Cu) thin film formed on the core 110. In addition, the second metal thin film 122 may be a Cu thin film like the first metal thin film 121, and is formed below the core 110. The first metal thin film 121 is electrically connected to the semiconductor chip (not shown) disposed on the top surface thereof, and the second metal thin film 122 is electrically connected to the PCB (not shown) disposed on the bottom surface thereof.

The first metal thin film 121 and the second metal thin film 122 may be formed on the top surface and the bottom surface of the core 110 through electroless Cu plating. Here, as illustrated in the drawing, the core 110 is famed from glass, and polymer layers 150 may be formed to adjoin the core 110. That is, the polymer layers 150 are faulted between the first metal thin film 121 and the core 110 and between the core 110 and the second metal thin film 122. Thus, the first metal thin film 121 and the second metal thin film 122 may be famed on the surfaces of the polymer layers 150 through electroless plating. The polymer layers 150 may be formed from PPG. In the prior art, such a polymer forms the interior of the IP package substrate, i.e. the core and the adjoining portions. In contrast, according to the present embodiment, the IC package substrate 100 is configured such that the core 110 is formed from glass instead of PPG and the adjoining polymer layers 150 is formed to enclose the core 110.

The metal line 130 allows current to flow throughout the IC package substrate 100. Specifically, as illustrated in the drawing, the metal line 130 may be configured to extend or be vertically inserted through the first metal thin film 121, the core 110, and the second metal thin film 122 to electrically connect the first metal thin film 121 forming the top surface of the IC package substrate 100 and the second metal thin film 122 forming the bottom surface of the IC package substrate 100.

The metal line 130 according to the present embodiment may be formed from Cu. For example, the metal line 130 famed from Cu may be manufactured by performing electroless Cu plating on a hole drilled in the IC package substrate 100. The metal line 130 as described above electrically connects the semiconductor chip (not shown), the IC package substrate 100, and the PCB (not shown).

In the present embodiment, the interlayer 140 is situated at the boundary between the metal line 130 and the core 110 to improve bonding force therebetween. A more detailed description will now be given of the interlayer 140.

The interlayer 140 is formed on the outer circumferential surface of the metal line 130. Specifically, the interlayer 140 is situated at the boundary between the metal line 130 and the core 110, at the boundary between the metal line 130 and the first metal thin film 121, and at the boundary between the metal line 130 and the second metal thin film 122.

Figure 2:
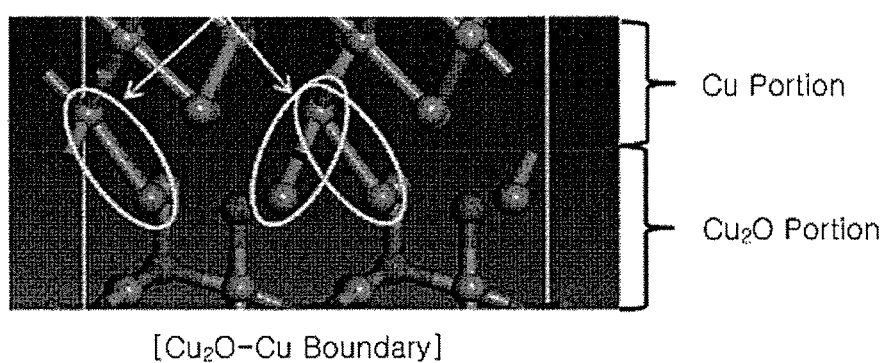
FIG. 2 illustrates a model of a chemical bond at the boundary between a copper (Cu) line and an interlayer of $Cu_2O$ according to an exemplary embodiment.
Figure 3:
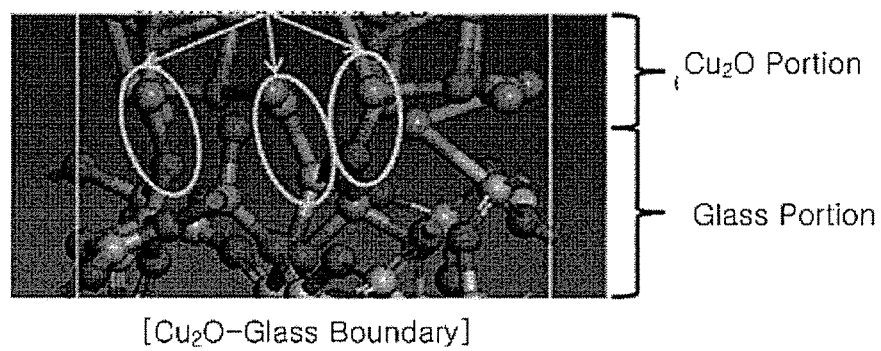
FIG. 3 illustrates a model of a chemical bond formed by the interlayer formed from $Cu_2O$ and glass at the boundary between the interlayer and the glass according to the exemplary embodiment.
Figure 4:
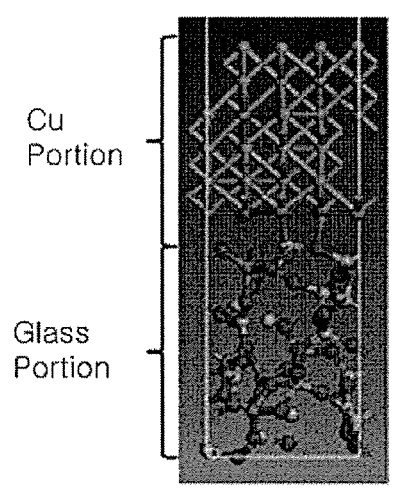
FIG. 4 illustrates a model of a bonding structure formed by Cu and glass at the boundary (left) and a model of a bonding structure formed by $Cu_2O$ and glass at the boundary (right) according to the exemplary embodiment.
Figure 4:
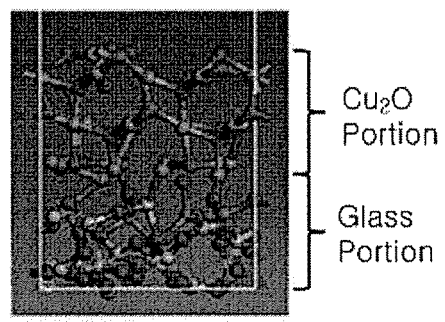

The interlayer 140 according to the present embodiment acts as an intermediating member to improve bonding force between the core 110 formed from glass and the metal line 130 formed from Cu, the existing bonding force between the core 110 and the metal line 130 being undesirable due to material properties thereof. In the present embodiment, the interlayer 140 formed from $Cu_2O$ is provided. It is known that a little $Cu_2O$ forming the interlayer 140 can be naturally famed during Cu plating, and act as activation sites to improve the rate of Cu deposition. FIG. 2 illustrates a model of a chemical bond formed by Cu of the metal line 130 and $Cu_2O$ of the interlayer 140 at the boundary between the metal line 130 and the interlayer 140 when the interlayer 140 formed from $Cu_2O$ is situated between the core 110 and the metal line 130. In addition, FIG. 3 illustrates a chemical bond formed by glass of the core 110 and $Cu_2O$ of the interlayer 140 at the boundary between the core 110 and the interlayer 140 when the interlayer 140 formed from $Cu_2O$ is situated between the core 110 and the metal line 130. A major factor influencing the bonging force between Cu and glass is the strength of a chemical bond between the surfaces of the two materials. In this aspect, a metal oxide such as $Cu_2O$ is expected to be more strongly bonded to glass than Cu. This is because glass may be regarded as an ionic system and thus the capability of Cu in an oxide to form a Cu—O bond in conjunction with oxygen in glass is better than the capability of Cu in metal. In addition, an additional chemical bond between oxygen in $Cu_2O$ and metal ions in glass is expected. FIG. 4 illustrates a model of a bonding structure formed by Cu and glass at the boundary (left) and a model of a bonding structure formed by $Cu_2O$ and glass at the boundary (right). As the results of simulation tests, the adsorption energy of the boundary defined by Cu and glass was measured to be 1.179 $J/m^2$, and the adsorption energy of the boundary defined by $Cu_2O$ and glass was measured to be 3.115 J/m². That is, bonding force between $Cu_2O$ and glass was proved to be about at least 2.7 times bonding force between Cu and glass.

The interlayer 140 formed from $Cu_2O$ forms a chemical bond together with the metal line 130 fouled from Cu, which abuts one side of the interlayer 140, and forms a chemical bond together with the core 110 formed from glass, which abuts the other side of the interlayer 140. Consequently, the metal line 130 and the core 110 have superior bonding force via the interlayer 140.

Figure 5:
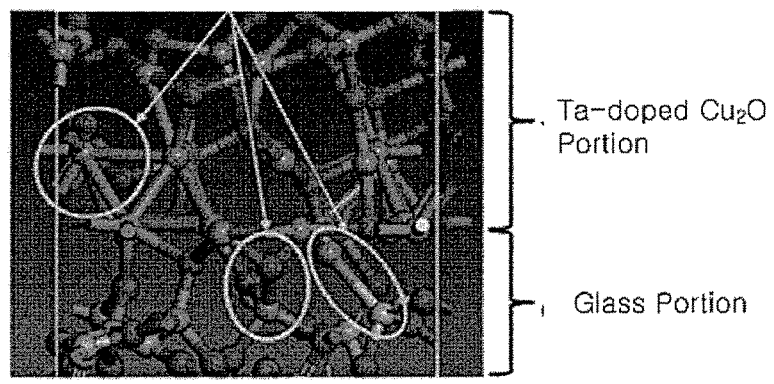
FIG. 5 illustrates a chemical bond formed by the interlayer formed from Ta-doped $Cu_2O$ and glass at the boundary between the interlayer and the glass according to an exemplary embodiment.

In addition, according to some embodiments, the interlayer 140 may be formed from $Cu_2O$ doped with a transition metal. Some transition metals have strong bonding force with glass, unlike Cu. This is because such transition metals have an electron structure able to actively form a covalent bond with oxygen in glass. Here, such transition metals may be at least one selected from a candidate group consisting of Ti, Cr, Hf, Nb, Ta, and the like. According to the present embodiment, the transition metal may be added to $Cu_2O$ as a dopant with a concentration of x atomic percent ($5<x<10$). The addition of the transition metal to $Cu_2O$ in this doping concentration may increase the overall strength of chemical bonding. FIG. 5 illustrates a chemical bond formed by glass of the core 110 and Ta-doped $Cu_2O$ of the interlayer 140 at the boundary between the core 110 and the interlayer 140 when the interlayer 140 formed from Ta-doped $Cu_2O$ is situated at the boundary between the core 110 and the metal line 130. When the interlayer 140 is formed from $Cu_2O$ doped with some transition metals as described above, the interlayer 140 forms a chemical bond together with the metal line 130 on one side and a chemical bond together with the core 110 on the other side, like the interlayer 140 formed from $Cu_2O$. Consequently, the metal line 130 and the core 110 have superior bonding force.

Figure 6:
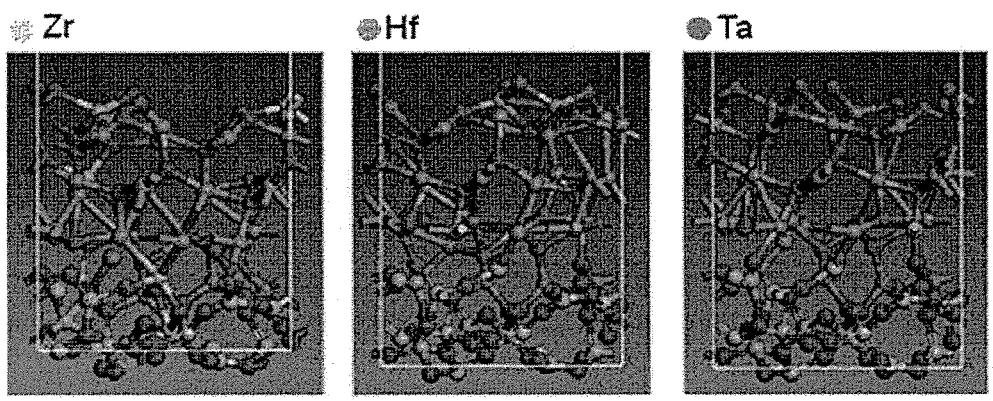
FIG. 6 illustrates a model of a bonding structure at a boundary defined by Zr-doped $Cu_2O$ and glass (left), a model of a bonding structure at a boundary defined by Hf-doped $Cu_2O$ and glass (middle), a model of a bonding structure at a boundary defined by Ta-doped $Cu_2O$ and glass (right) according to exemplary embodiments.

FIG. 6 illustrates a model of a bonding structure at a boundary defined by Zr-doped $Cu_2O$ and glass (left), a model of a bonding structure at a boundary defined by Hf-doped $Cu_2O$ and glass (middle), a model of a bonding structure at a boundary defined by Ta-doped $Cu_2O$ and glass (right) to test levels of bonding force with glass depending on the types of doped transition metals. As the results of simulation tests, in the case of Zr, the adsorption energy of the boundary was measured to be 4.975 J/m². This is an improvement over the adsorption energy 3.115 J/m² at the boundary defined by $Cu_2O$ doped with no transition metal and glass and is about 4.2 times the adsorption energy at the boundary defined by Cu and glass. However, increases in the adsorption energy at the boundary were saturated when the doping content reached 4.2 atomic percent. In contrast, in the case of Hf and Ta, the adsorption energies at the boundaries with glass were measured to be 5.056 J/m² and 5.234 J/m², respectively. That is, in the case of Hf and Ta, at doping contents of 5.6 atomic percent, the adsorption energies were observed to be about 4.3 and 4.4 times the adsorption energy at the boundary defined by Cu and glass. In addition, the adsorption energies, i.e. bonding forces, increased with increases in the doping contents. Thus, when Hf and Ta were doped in the range of 5 atomic percent<x<10 atomic percent, improvements in bonding forces can be expected to be about 4.3 and 4.4 times bonding force in the case of Cu doped with no transition metal. That is, when the interlayer 140 formed from $Cu_2O$ doped with Hf or Ta from among transition metals was provided, bonding force between the metal line 130 formed from Cu and the core 110 formed from glass was proved to be stronger than bonding force when the interlayer 140 was formed from $Cu_2O$ doped with Zr.

In addition, according to some embodiments, the interlayer 140 may be formed from a metal oxide including Cu and a transition metal. The interlayer 140 may be formed from a ternary or quaternary metal oxide. When the interlayer 140 is formed from a ternary metal oxide, the interlayer 140 may be formed from delafossite. For example, the interlayer 140 may be formed from $CuCrO_2$. When the interlayer 140 is formed from a quaternary metal oxide, the interlayer 140 may be formed from perovskite. For example, the interlayer 140 may be formed from $Cu_3CaTi_4O_{12}$. Since the interlayer 140 is in a form of a mixture of an interlayer formed from $Cu_2O$ and an interlayer formed from $Cu_2O$ doped with a transition metal, the interlayer 140 forms strong chemical bonds together with the metal line 130 on one side and the core 110 on the other side, whereby the metal line 130 and the core 110 have superior bonding force.

As set forth above, the IC package substrate 100 according to some present embodiments has the interlayer 140 between the metal line 130 faulted from Cu and the core 110 formed from glass to form chemical bonds with the metal line 130 and the core 110, the interlayer 140 being formed from one selected from among $Cu_2O$, transition metal-doped $Cu_2O$, a ternary metal oxide including Cu and a transition metal, and a quaternary metal oxide including Cu and a transition metal. This can consequently improve bonding force between the metal line 130 and the core 110, thereby realizing superior electrical conductivity and reliability, improving yields, and reducing manufacturing costs.

According to some embodiments, the interlayer 140 is also formed at the boundary between the metal line 130 and the first metal thin film 121 and at the boundary between the metal line 130 and the second metal thin film 122. The portions of the interlayer 140 formed at these boundaries serve to fill gaps defined between the metal line and the first metal thin film 121 and between the metal line 130 and the second metal thin film 122 that are formed due to the portion of the interlayer 140 famed at the boundary between the metal line 130 and the core 110. Since the interlayer 140 can form a chemical bond with Cu as illustrated in FIG. 2, both the portions of the interlayer 140 formed at these boundaries form chemical bonds with Cu, such that the metal line 130 and the first metal thin film 121 have reliable bonding force and the metal line 130 and the second metal thin film 122 have reliable bonding force.

The foregoing descriptions of specific exemplary embodiments of the present disclosure have been presented with respect to the drawings. They are not intended to be exhaustive or to limit the present disclosure to the precise forms disclosed herein, and many modifications and variations are obviously possible for a person having ordinary skill in the art in light of the above teachings.

It is intended therefore that the scope of the present disclosure not be limited to the foregoing embodiments, but be defined by the Claims appended hereto and their equivalents.

EXPLANATION OF REFERENCE NUMERALS

100: IC package substrate
110: core,
121: first metal thin film
122: second metal thin film
130: metal line
140: interlayer
150: polymer layer

What is claimed is:

1. A substrate for an integrated circuit package, comprising:
   a core formed from glass;
   a first metal thin film disposed on the core, the first metal thin film comprising copper (Cu);
   a second metal thin film disposed below the core, the second metal thin film comprising Cu;
   a metal line extending through the first metal thin film, the core, and the second metal thin film to electrically connect the first metal thin film and the second metal thin film to each other, the metal line comprising Cu; and
   an interlayer disposed on an outer circumferential surface of the metal line, the interlayer comprising one selected from the group consisting of $Cu_2O$, $Cu_2O$ doped with a first transition metal, and a metal oxide comprising Cu and a second transition metal.

2. The substrate of claim 1, wherein the $Cu_2O$ comprises x atomic percent of the first transition metal, where $5<x<10$.

3. The substrate of claim 1, wherein each of the first and second transition metal is at least one selected from a candidate group consisting of Ti, Cr, Hf, Nb, and Ta.

4. The substrate of claim 1, wherein the metal oxide comprises a ternary or quaternary metal oxide.

5. The substrate of claim 4, wherein the metal oxide comprises perovskite.

6. The substrate of claim 4, wherein the metal oxide comprises delafossite.

7. The substrate of claim 1, the substrate being situated between a semiconductor chip and a printed circuit board to electrically connect the semiconductor chip and the printed circuit board to each other.

8. The substrate of claim 7, wherein the first metal thin film is electrically connected to the semiconductor chip, and the second metal thin film is electrically connected to the printed circuit board.

9. The substrate of claim 1, further comprising polymer layers situated between the first metal thin film and the core and between the core and the second metal thin film, respectively.

10. The substrate of claim 9, wherein the polymer layers are formed from prepreg.

* * * * *